(12) United States Patent
Lee et al.

(10) Patent No.: US 10,855,096 B2
(45) Date of Patent: Dec. 1, 2020

(54) QUICK CHARGER FOR VEHICLE

(71) Applicant: UNICK CORPORATION, Gyeongsangnam-do (KR)

(72) Inventors: Chang-Hoon Lee, Gyeongsangnam-do (KR); Wook-Hyun Choi, Gyeongsangnam-do (KR); Sung-Min Kim, Gyeongsangnam-do (KR); Tae-Hun Lee, Gyeongsangnam-do (KR)

(73) Assignee: UNICK CORPORATION, Gyeongsangnam-do (KR)

( * ) Notice: Subject to any disclaimer, the term of this patent is extended or adjusted under 35 U.S.C. 154(b) by 289 days.

(21) Appl. No.: 15/960,498

(22) Filed: Apr. 23, 2018

(65) Prior Publication Data

US 2019/0074697 A1    Mar. 7, 2019

(30) Foreign Application Priority Data

Sep. 5, 2017  (KR) ......................... 10-2017-0113333

(51) Int. Cl.
*H02J 7/00* (2006.01)
*H02J 7/34* (2006.01)
(Continued)

(52) U.S. Cl.
CPC .......... *H02J 7/007* (2013.01); *G01R 31/3835* (2019.01); *H01M 10/44* (2013.01);
(Continued)

(58) Field of Classification Search
None
See application file for complete search history.

(56) References Cited

U.S. PATENT DOCUMENTS

| 2008/0185990 A1* | 8/2008 | Hsu | ...................... H01M 2/1022 320/103 |
| 2019/0089170 A1* | 3/2019 | Liu | ......................... H02J 7/007 |

FOREIGN PATENT DOCUMENTS

CN    107231013 A  * 10/2017  ............ H02J 7/0045
KR   1020130081570 A1    7/2013
(Continued)

OTHER PUBLICATIONS

Fitipower,FP6601Q USB Dedicated Charging Port Controller for Fast Charging Protocol and QC 2.0/3.0, Aug. 2016, p. 2 <https://datasheet.lcsc.com/szlcsc/FP6601Q_C86198.pdf> (Year: 2016).*

*Primary Examiner* — David V Henze-Gongola
(74) *Attorney, Agent, or Firm* — Kinney & Lange, P.A.

(57) ABSTRACT

A quick charger for a vehicle performs normal charging or quick charging depending on whether a device connected thereto supports quick charging. The quick charger includes: an input terminal receiving power from a vehicle; an output port configured to be connected to an electronic device and comprising a power port and a communication port; and a charging voltage changing module configured to convert a voltage of the power applied to the input terminal into a normal charging voltage or a quick charging voltage larger than the normal charging voltage, depending on a level of a voltage sensed at the communication port connected to the electronic device, wherein the electronic device is charged with the normal charging voltage at a normal speed and is charged with the quick charging voltage at a faster speed than the normal speed. With the above-described configuration, the quick charger can automatically perform normal charging or quick charging depending on the type of the electronic device connected thereto.

1 Claim, 13 Drawing Sheets

(51) Int. Cl.
  *G01R 31/3835* (2019.01)
  *H01M 10/44* (2006.01)
  *H02J 7/04* (2006.01)

(52) U.S. Cl.
  CPC ............ *H02J 7/0042* (2013.01); *H02J 7/045* (2013.01); *H02J 7/342* (2020.01); *H02J 7/00* (2013.01)

(56) References Cited

FOREIGN PATENT DOCUMENTS

KR  2020150002779 A1  7/2015
KR  1020150129793 A1  11/2015

* cited by examiner

200(210,220,230)
600(610,620)

QUICK CHARGER FOR VEHICLE

CROSS-REFERENCE TO RELATED APPLICATIONS

This application claims the priority of Korean Patent Application No. 2017-0113333 filed on Sep. 5, 2017, in the Korean Intellectual Property Office, the disclosure of which is hereby incorporated by reference in its entirety.

BACKGROUND

1. Technical Field

The present disclosure relates to a quick charger for a vehicle, and more particularly to a quick charger for a vehicle that performs normal charging or quick charging depending on whether a device connected thereto supports quick charging.

2. Description of the Related Art

As external electronic devices for vehicles such as mobile phones, navigation devices and black boxes are increasingly used, modern vehicles are equipped with power outlets so as to stably supply power to such external electronic devices. Such a power outlet is installed integrally with a cigarette lighter to efficiently utilize the installation space and to save the cost, or is installed separately from a cigarette lighter in order to supply power more stably.

Among external electronic devices for vehicles, a navigation device and a black box are powered from a vehicle through a dedicated cable including a cigar plug. On the other hand, a mobile phone further requires a charging adapter in addition to a charging cable. Korean Utility Model Publication No. 2009-0004005 (published on Apr. 29, 2009) discloses a USB adaptor for vehicles. The adaptor includes a case in which a charging device is disposed, a plug electrically connected to the charging device and to be inserted into a cigarette lighter socket, and the socket disposed in the case and electrically connected to the charging device. The existing adaptor has the shortcoming in that even if a device capable of quick charging such as Quick Charge 2.0™ from Qualcomm®, for example, is connected to the adaptor, the adaptor is incapable of quick charge.

SUMMARY

It is an object of the present disclosure to provide a quick charger for a vehicle that can quickly charge an electronic device.

It is another object of the present disclosure to provide a quick charger for a vehicle that can quickly charge an electronic device depending on its type.

In accordance with one aspect of the present disclosure, a quick charger for a vehicle includes: an input terminal receiving power from a vehicle; an output port connected to an electronic device and comprising a power port and a communication port; a charging voltage changing module converting a voltage of the power input to the input terminal into a normal charging voltage or a quick charging voltage larger than the normal charging voltage, depending on a level of a voltage sensed at the communication port connected to the electronic device, wherein the electronic device is charged with the normal charging voltage at a normal speed and is charged with the quick charging voltage faster.

The communication port may have a D+ pin and a D− pin, the normal charging voltage may be 5 V, and the charging voltage changing module may convert the voltage of the power applied to the input terminal into 5 V if a voltage at the D+ pin is 0.6 V and a voltage at the D− pin is 0 V.

The communication port may have the D+ pin and the D− pin, the quick charging voltage may be 9 V or 12 V, and the charging voltage changing module may convert the voltage of the power applied to the input terminal into 9 V if the voltage at the D+ pin is 3.3 V and the voltage at the D− pin is 0.6 V, and convert the voltage of the power applied to the input terminal into 12 V if the voltage at the D+ pin is 0.6 V and the voltage at the D− pin is 0.6 V.

The quick charger may further include a shield covering at least one of the input terminal, the output port and the charging voltage changing module. The shield may include: a shield frame disposed on a substrate having the input terminal, the output port and the charging voltage changing module thereon, and a shield cover fastened to the shield frame to cover an open top of the shield frame.

At least one cover hole may be formed in the shield cover, and the shield cover may be concave toward the shield frame.

According to an exemplary embodiment of the present disclosure, a quick charger for a vehicle can automatically perform normal charging or quick charging depending on the type of the electronic device connected thereto.

DETAILED DESCRIPTION

Hereinafter, exemplary embodiments of the present disclosure will be described in detail with reference to the accompanying drawings.

It is to be noted that the present disclosure is not limited to exemplary embodiments disclosed herein but may be implemented in various different ways. The exemplary embodiments are provided for a thorough and complete understanding of the present disclosure, and for fully conveying the scope of the present disclosure to those skilled in the art. Like reference numbers are used herein to designate like elements throughout the various views.

Figure 1:
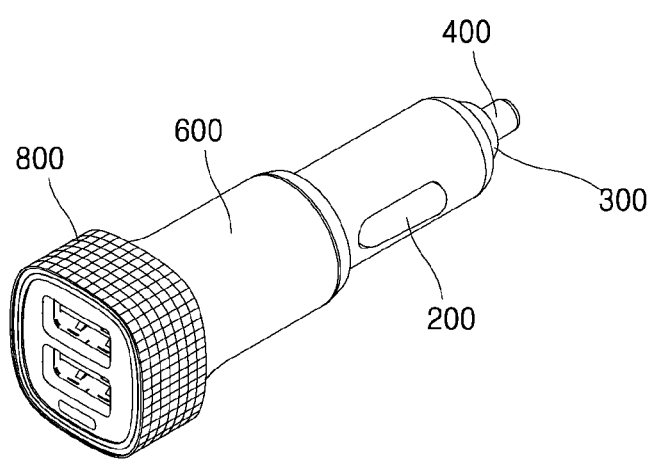
FIG. 1 is a perspective view of a quick charger for a vehicle according to a first exemplary embodiment of the present disclosure.
Figure 2:
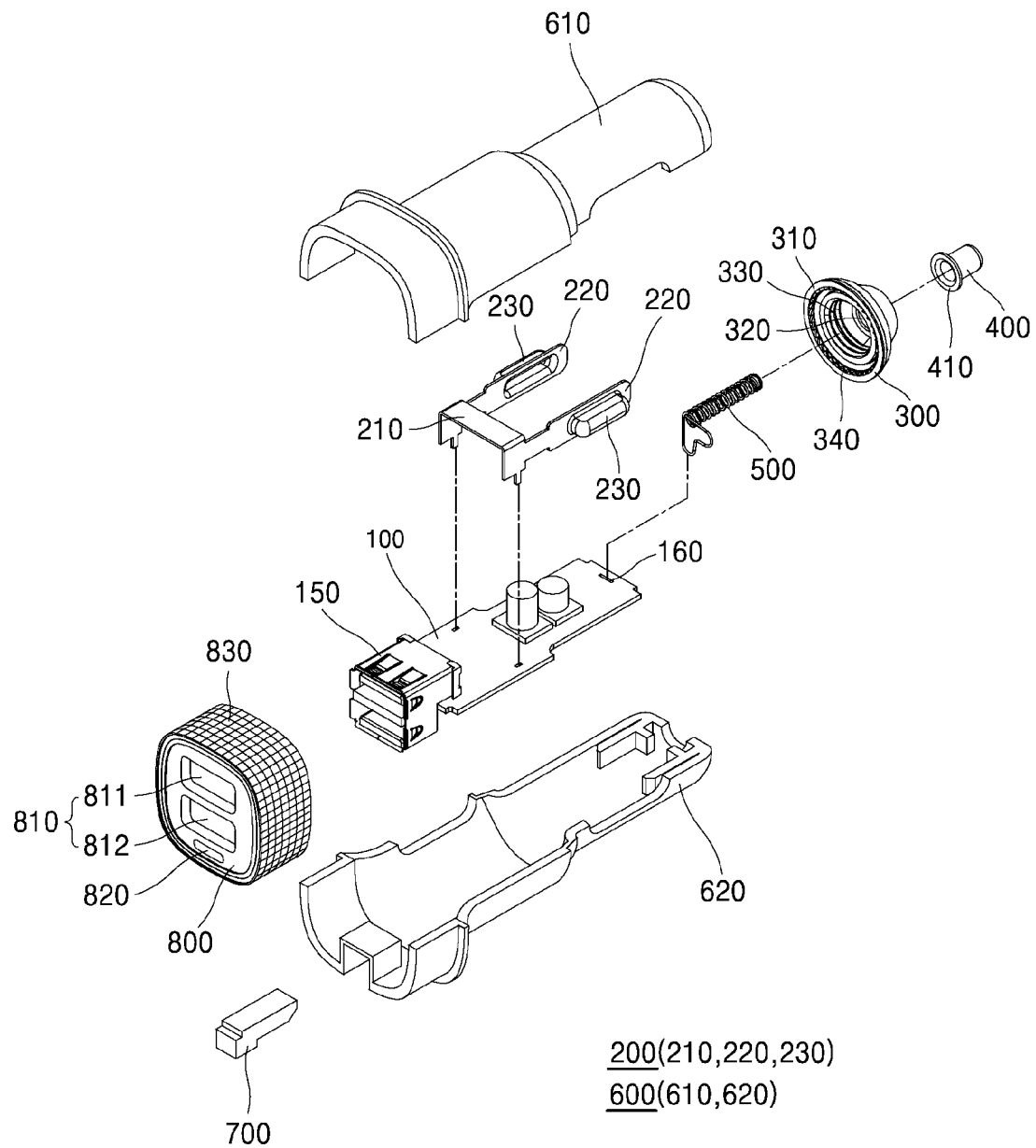
FIG. 2 is an exploded perspective view of the quick charger according to the first exemplary embodiment of the present disclosure.
Figure 3:
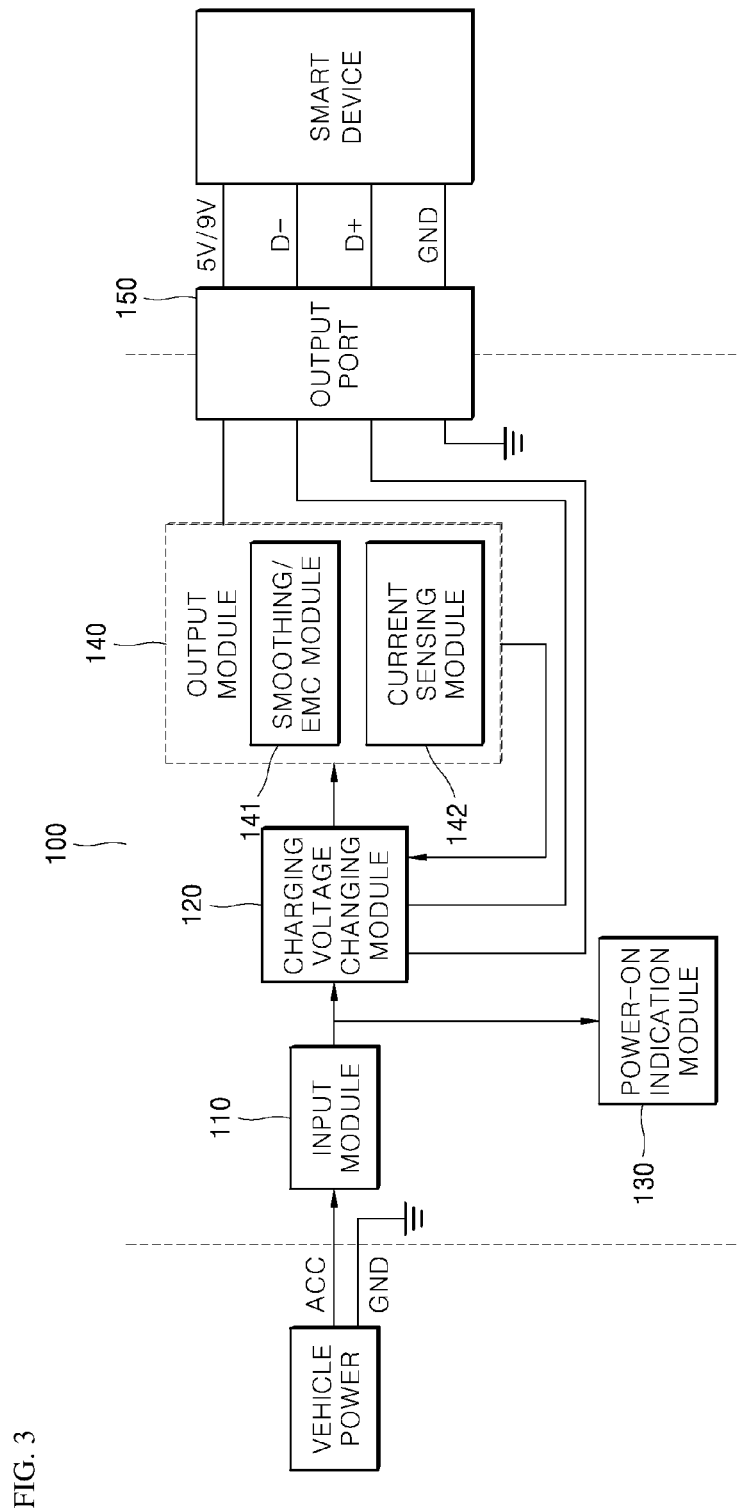
FIG. 3 is a block diagram of the quick charger according to the first exemplary embodiment of the present disclosure.

FIG. 1 is a perspective view of a quick charger for a vehicle according to a first exemplary embodiment of the present disclosure. FIG. 2 is an exploded perspective view of the quick charger according to the first exemplary embodiment of the present disclosure. FIG. 3 is a block diagram of the quick charger according to the first exemplary embodiment of the present disclosure.

The quick charger according to the first exemplary embodiment of the present disclosure includes a substrate 100, a ground terminal 200 connected to the substrate 100, a cover 300 disposed on a side of the substrate 100, an input terminal 400 connected to the substrate 100 and exposed to the outside through the cover 300, elastic means 500 for applying elasticity to the input terminal 400, a case 600 accommodating the substrate 100 and the ground terminal 200, and a knob 800, as shown in FIGS. 1 and 2.

The substrate 100 is a printed circuit board (PCB) having conductor circuitry formed thereon for transmitting a power applied through the ground terminal 200 and the input terminal 400 to an electronic device. As shown in FIG. 2, an input/output port 150 is disposed on the upper surface of the substrate 100, and a power-on indication module 130, i.e., a lamp, for indicating the current charging condition is disposed on the lower surface of the substrate 100. In addition, a mounting slot 160 for mounting the elastic means 500 is formed at the rear end of the substrate 100.

According to the exemplary embodiment of the present disclosure, it is determined whether an electronic device connected to the input/output port 150 of the substrate 100 can support fast charging, and normal charging or quick charging is carried out depending on the determination results. To this end, as shown in FIG. 3, the substrate 100 includes an input module 110, a charging voltage changing module 120, a power-on indication module 130, an output module 140, and the input/output port 150.

The input module 110 reduces noise of the power supplied from the power source of the vehicle (EMC) through the input terminal 400 and cuts off the reverse voltage. In addition, the power processed by the input module 110 is applied to the charging voltage changing module 120.

The charging voltage changing module 120 adjusts the voltage of the power applied from the input module 110. According to the exemplary embodiment of the present disclosure, the charging voltage changing module 120 receives the voltage of 13.5 V from the input module 110 and converts the charging voltage into a normal charging voltage or a quick charging voltage. To this end, the charging voltage changing module 120 determines whether to output the normal charging voltage or the quick charging voltage depending on the voltage received from the communication port (D+, D−) of the output port connected to the electronic device to exchange data. For example, the charging voltage changing module 120 outputs the normal charging voltage of 5 V if the voltage at the D+ pin of the communication port is 0.6 V and the voltage at the D− pin is 0 V or no voltage information for the D+ pin and the D− pin is available. On the other hand, the charging voltage changing module 120 outputs the quick charging voltage of 9V if the voltage at the D+ pin of the communication port is 3.3 V and the voltage at the D− pin is 0.6 V. In addition, the charging voltage changing module 120 outputs the charging voltage of 12 V if the voltage at the D+ pin of the communication port is 0.6V and the voltage at the D− pin is 0.6 V.

The power-on indication module 130 indicates whether the power is supplied from the input module 110 to the charging voltage changing module 120 by lighting. Although FIG. 3 shows that the power-on indication module 130 is powered by receiving the power from the input module 110, this is merely illustrative. That is, the power-on indication module 130 may be lit up by receiving power from the charging voltage changing module 120. In this instance, the power-on indication module 130 may also indicate whether it is the normal charging mode or quick charging mode with different colors, in addition whether power is applied or not. For example, the power-on indication module 130 may not be lit up if no power is applied to the charging voltage changing module 120. The power-on indication module 130 may indicate yellow light if only the power is applied. In addition, when the charging voltage changing module 120 outputs the normal charging voltage, red light may be indicated. When the charging voltage changing module 120 outputs the quick charging voltage, blue light may be indicated. It is to be understood that this is merely illustrative, and different light may be indicated for each situation. It is to be noted that different light should indicate different situations. In addition to the indication by the colors, letters indicating the normal charging mode and the quick charging mode may be marked on the knob by laser cut or the like, so that light may pass through the letters for the selected mode.

The output module 140 reprocesses the power output from the charging voltage changing module 120 to transfer it to the output port. To this end, the output module 140 includes a smoothing/EMC module 141 for removing noise (EMC) from the power source applied by the charging voltage changing module 120 and performing a smoothing operation. In addition, the output module 140 includes a current sensing module 142 to sense the current output from the smoothing/EMC module 141 to the output port 150 and output the sensed current value to the charging voltage changing module 120 as a feedback signal. In doing so, the charging voltage changing module 120 may adjust the magnitude of the output current according to the value of the current fed back from the current sensing module 142 so that the current having a predetermined magnitude appropriate and accurate to charge the electronic device can be output from the charging voltage changing module 120.

The input/output port 150 outputs the power output from the output module 140 to the electronic device or receives data output from the electronic device. The input/output port 150 may be a USB socket connector, for example.

The ground terminal 200 comes in contact with the negative pole of the vehicle through the socket of the vehicle to receive power, and also fastens the quick charger to the socket of the vehicle. The ground terminal 200 includes a first member 210 having a U-shape surrounding the input/output port 150, second members 220 extending from the first member 210 in the longitudinal direction of the case 600, and contact protrusions 230 each extending along the respective second members 220 and having a convex semi-cylindrical shape. The contact protrusions 230 protrude out of the case 600 and come in contact with the inner walls of the socket when the quick charger is inserted into the socket of the vehicle.

The cover 300 has a hemispherical shape to cover the open other end of the case 600. More specifically, it has the hemispherical shape with a flange 310 around it. A terminal hole 320 through which the input terminal 400 passes is formed at the center of the cover 300. A thread 330 for coupling with the open other end of the case 600 is formed on the inner circumferential surface of the cover 300. A ratchet 340 is formed on one surface of the flange 310 (the surface in contact with the rear end of the case 600). The ratchet 340 is comprised of a plurality of teeth and is disposed radially along the surface of the flange 310.

The ratchet 340 is to limit the reverse rotation of the cover 300 together with a pawl. The teeth of the ratchet 340 are formed in one direction, allowing for rotation of the cover 300 in the forward direction (coupling direction) but not in the backward direction (releasing direction). Therefore, it is possible to prevent the cover 300 coupled to the open other end of the case 600 from being undesirably separated. In particular, by employing two or more pawls, it is possible to prevent reverse rotation more effectively.

The input terminal 400 comes in contact with the positive pole of the vehicle through the socket of the vehicle to receive power, and transmits the power to the input module 110. The input terminal 400 is formed in a cylindrical shape. A flange 410 is formed at the front end of the input terminal 400 to prevent the input terminal 400 from being separated through the terminal hole 320 of the cover 300. Further, the rear end of the input terminal 400 is formed in a hemispherical shape so as to easily come in contact with the bottom of the socket.

The elastic means 500 electrically connects the substrate 100 with the input terminal 400 and elastically pushes the input terminal 400 toward the outside of the cover 300. In other words, the elastic means 500 delivers the power supplied from the input terminal 400 to the input/output port 150 through the substrate 100 and bring the input terminal 400 into tight contact with the bottom of the socket.

The case 600 has a hollow cylindrical shape. A knob 800 to be described later is coupled to one open end of the case 600, and the cover 300 is coupled to the other open end. The case 600 includes a first case 610 and a second case 620 having shapes symmetrical to each other. The first case 610 has a semi-cylindrical shape convex upward, and the second case 620 has a semi-cylindrical shape convex downward. The diameters of the first and second cases become larger stepwise toward knob 800. The case 600 is formed by coupling the first case 610 with the second case 620, and has a multi-step cylindrical shape having diameter increasing toward the front end.

The knob 800 has a cup shape that covers the edge of the opened end of the case 600. Insertion slots 810 into which USB plug connectors (not shown) are inserted and a seating slot 820 where a prism 700 for indicating the charging condition is installed are formed in the front face of the knob 800. According to this exemplary embodiment of the present disclosure, there are two output ports 150, and accordingly the insertion hole 810 also includes a first insertion hole 811 and a second insertion hole 812. The front surface of the knob 800 is subjected to hairline surface treatment, and the outer peripheral surface 830 of the knob 800 is subjected to knurling. The hairline surface treatment is employed to improve the appearance of the front surface of the knob 800. The knurling treatment is employed to give adhesion on the outer periphery surface of the knob 800 to thereby prevent slippery when the quick charger is inserted into or separated from the socket.

As described above, according to the exemplary embodiment of the present disclosure, a quick charger for a vehicle that automatically performs normal charging or quick charging depending on the type of the electronic device connected thereto.

Hereinafter, a quick charger for a vehicle with a shield according to a second exemplary embodiment of the present disclosure will be described with reference to the drawings. In the following description, the same components as those of the first exemplary embodiment will not be described to avoid redundancy.

Figure 4:
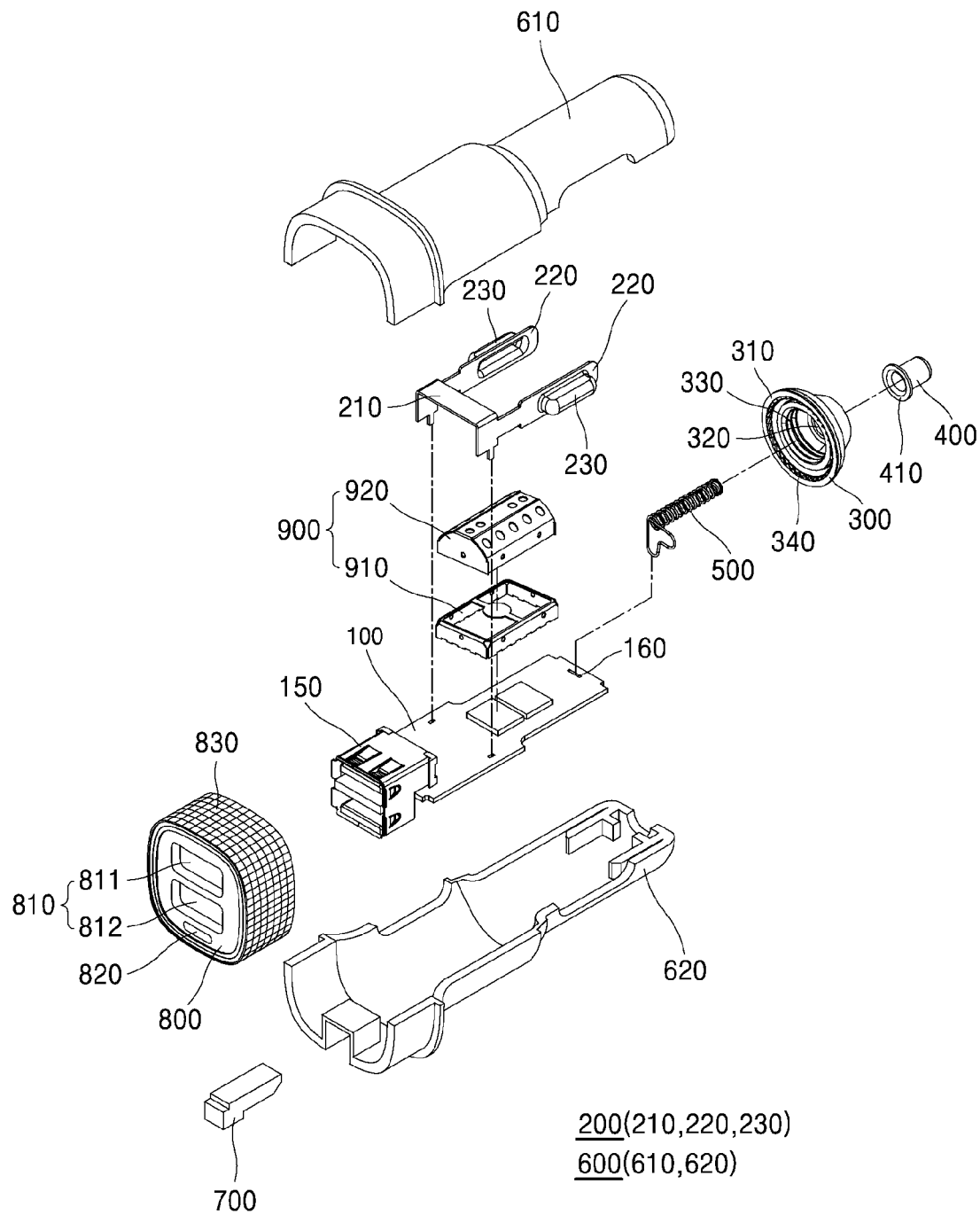
FIG. 4 is a perspective view of a quick charger for a vehicle according to a second exemplary embodiment of the present disclosure.

FIG. 4 is a perspective view of a quick charger for a vehicle according to a second exemplary embodiment of the present disclosure.

The quick charger according to the first exemplary embodiment of the present disclosure includes a substrate 100, a ground terminal 200 connected to the substrate 100, a cover 300 disposed on a side of the substrate 100, an input terminal 400 connected to the substrate 100 and exposed to the outside through the cover 300, elastic means 500 for applying elasticity to the input terminal 400, a case 600 accommodating the substrate 100 and the ground terminal 200, a knob 800, and a shield 900, as shown in FIG. 4. The components except the shield 900 are identical to those of the first exemplary embodiment; and, therefore, the redundant description will be omitted.

The shield 900 is employed to improve EMC (Electro Magnetic Compatibility) of the quick charger for a vehicle according to the exemplary embodiment of the present disclosure used in a vehicle environment. The shield 900 includes a shield frame 910 including a metal material, and a shield cover 920 also including a metal material and coupled to the shield frame 910.

Figure 5:
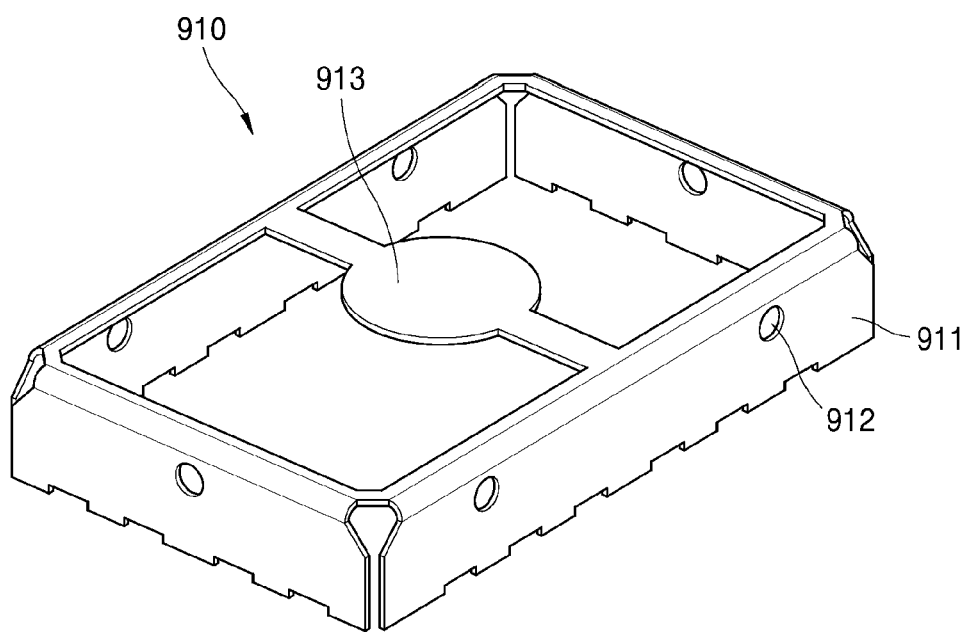
FIG. 5 is a perspective view of the shield frame of the quick charger according to the second exemplary embodiment of the present disclosure.

FIG. 5 is a perspective view of the shield frame of the quick charger according to the second exemplary embodiment of the present disclosure.

The shield frame 910 is for mounting the shield cover 920 and is disposed directly on the substrate 100 described above. Referring to FIG. 5, the frame cover is mounted on the shield frame 910, with the top of the shield frame 910 open to allow for inspection of the substrate 100 under the shield cover 920. Accordingly, the shield frame 910 includes frame side walls 911, frame fastening holes 913 formed in the frame side walls 911, and a frame connector 913 connecting between the frame side walls.

The frame side wall 911s together with the shield cover 920 blocks the electromagnetic noise generated in the shield 900 from leaking and prevents electromagnetic noise from being introduced into the shield 900 from the outside. In addition, the bottom of the frame side walls 911 forms grooves so as to be spaced apart from the circuit pattern of the substrate 100, thereby preventing a short-circuit that may be formed when a PSR (photo imageable solder resist) ink is peeled off. Further, the grooves formed at the bottom of the frame side walls 911 work as hot-air passages while surface mounting technology (SMT) is performed, and work as passages for releasing heat generated when the quick charger is being operated.

Figure 7:
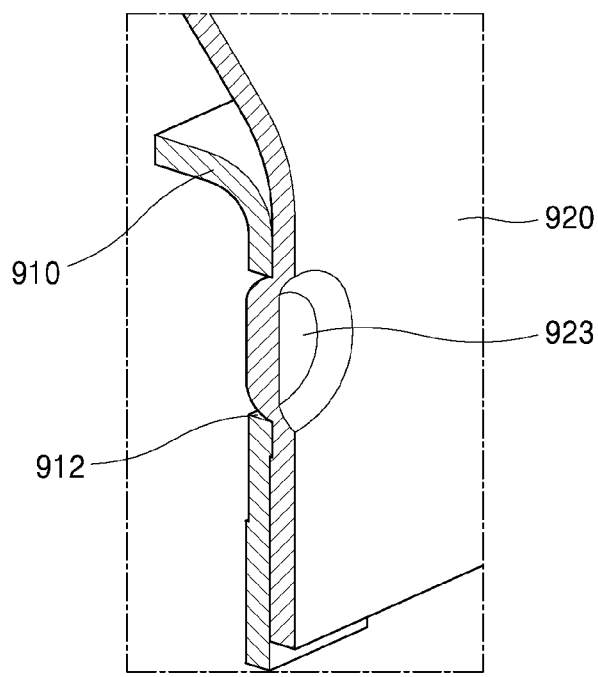
FIG. 7 is a perspective view of the cover frame fastened to the shield cover of the quick charger according to the second exemplary embodiment of the present disclosure.

FIG. 7 is a perspective view of the cover frame fastened to the shield cover of the quick charger according to the second exemplary embodiment of the present disclosure.

The frame fastening holes 912 are used to fasten the shield cover 920. As shown in FIG. 7, a cover protrusion 923 of the shield cover 920 is forcibly engaged so that the shield cover 920 is fastened to the shield frame 920, so as not to be separated.

The frame connector 913 is formed to connect between the tops of the frame side walls 911 so that the shield frame 910 can be picked up. In addition, the frame connector 913 works to block some of the electromagnetic waves generated from the substrate 100.

Figure 6:
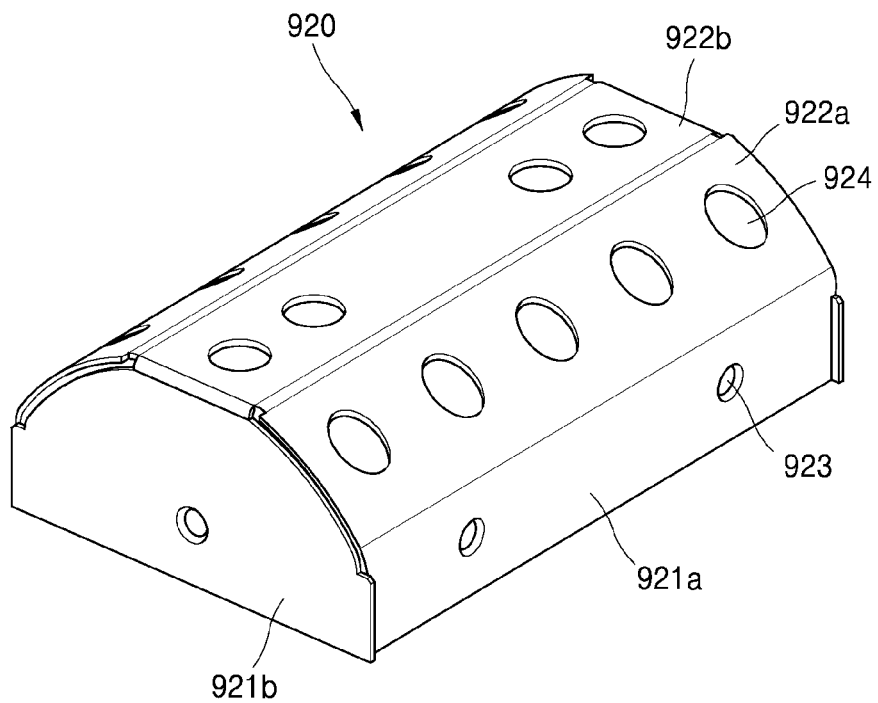
FIG. 6 is a perspective view of the shield cover of the quick charger according to the second exemplary embodiment of the present disclosure.

FIG. 6 is a perspective view of the shield cover of the quick charger according to the second exemplary embodiment of the present disclosure.

The shield cover 920 is fastened to the shield frame 910 so as to cover the shield frame 910. It blocks the electromagnetic waves generated inside the shield frame 910 from leaking, and blocks electromagnetic wave outside the shield frame 910 from being introduced into the shield frame 910. The shield cover 920 includes cover side walls 921, a cover top plate 922, cover fastening protrusions 923, and cover holes 924, as shown in FIG. 6.

The cover side walls 921 are for fastening the shield cover 920 to the shield frame 910 and are coupled with and in contact with the outer faces of the frame side walls 911. According to this exemplary embodiment, the shield frame 910 may have a rectangular shape, for example, and the cover sidewalls 921 coupled with the shield frame 910 may also have a rectangular shape, for example. Thus, the cover side walls 921 include a pair of first cover side walls 921a spaced apart from and opposed to each other, and a pair of second cover side walls 921a spaced apart from and opposed to each other and each connecting ends of the first cover side walls 921a.

The cover top plate 922 is extended from the cover side walls 921 and covers the open top of the cover side wall 921s. Here, the cover top plate 922 is formed over the cover side walls 921 in a substantially semi-circular shape, that is, a concaved shape toward the shield frame. To this end, the cover top plate 922 includes a pair of first cover top plates 922a and a second cover top plate 922b to connect between the pair of first cover top plates 922a.

Figure 8:
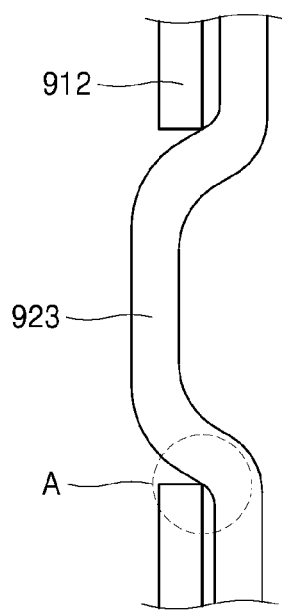
FIG. 8 is a cross-sectional view of the cover frame fastened to the shield cover of the quick charger according to the second exemplary embodiment of the present disclosure.

FIG. 8 is a cross-sectional view of the cover frame fastened to the shield cover of the quick charger according to the second exemplary embodiment of the present disclosure.

The cover fastening protrusion 923 is formed on the cover side wall 921 and is forcibly engaged into the frame fastening hole 912 described above. As shown in FIG. 8, the cover fastening protrusion 923 has an embossed shape and remains engaged into the frame fastening hole 912, so that noise can be prevented.

The cover holes 924 are formed in the cover top plate 922 as passages via which heat generated inside the shield 900 is released. According to this exemplary embodiment, the cover holes 924 may include five cover holes 924 formed spaced apart from one another in each of the pair of first cover top plates 922a, and four cover holes 924, two on each edge, are formed in the second cover top plate 922b. It is, however, to be understood that this is merely illustrative. The numbers of cover holes 924 may be more or less than the above-described numbers. In addition, although the shape of the cover holes 924 is a circle, it may have a polygonal shape including a semi-circular shape, an elliptical shape, a semi-elliptical shape, a triangular shape, a square shape, etc.

Figure 9:
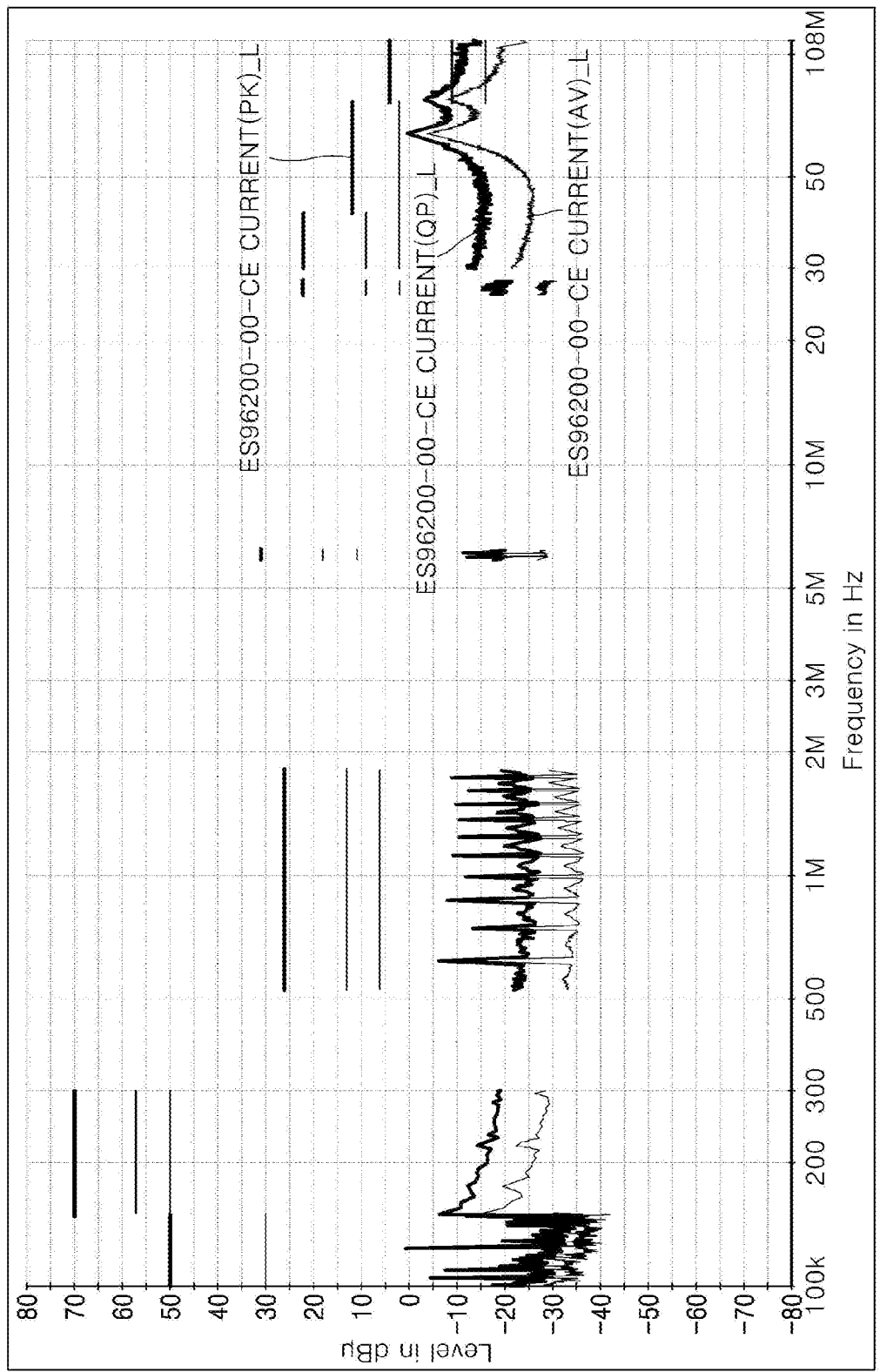
FIG. 9 is a graph showing noise measured before employing the shield of the quick charger according to the second exemplary embodiment of the present disclosure.
Figure 10:
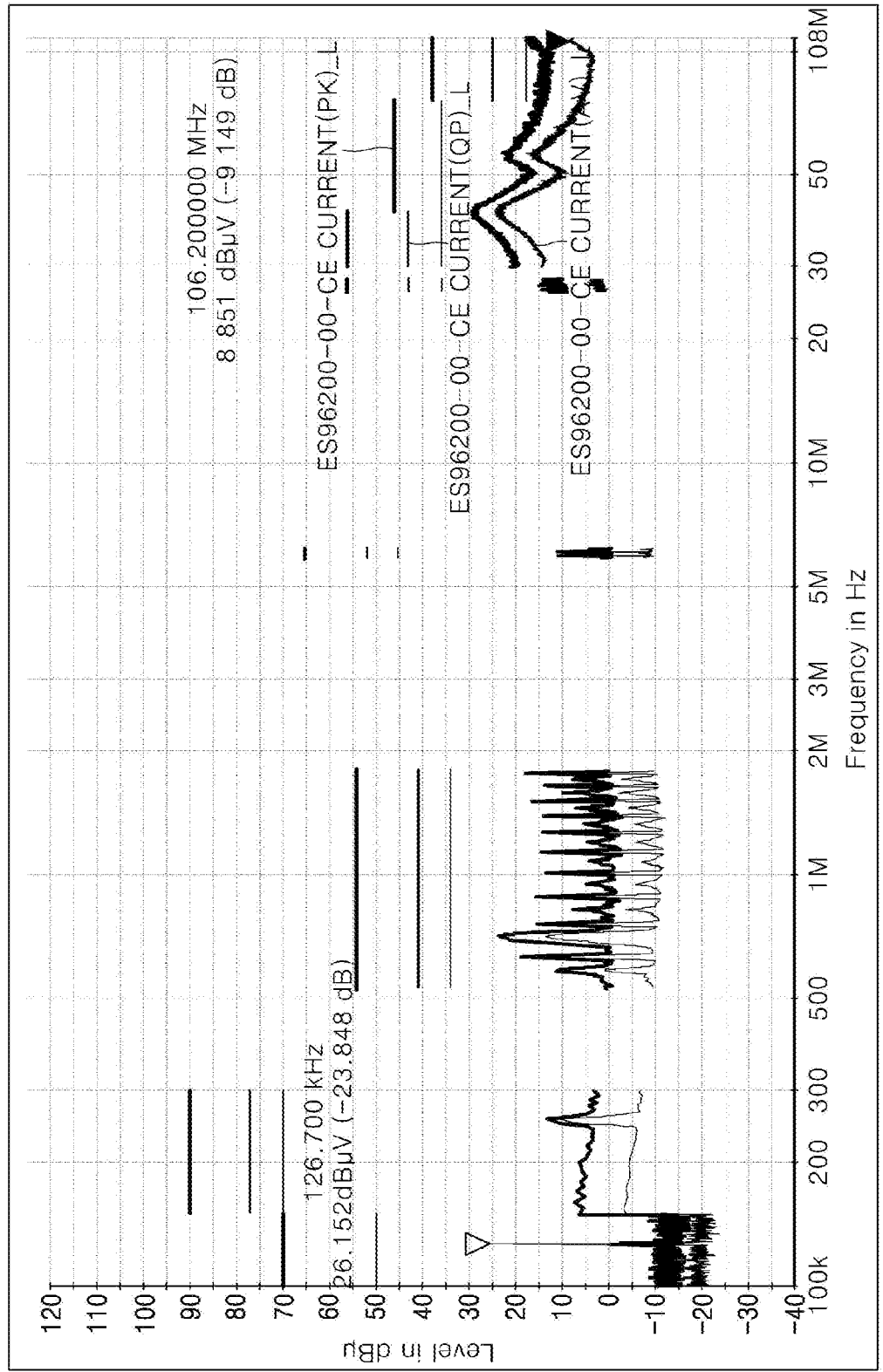
FIG. 10 is a graph showing noise measured after employing the shield of the quick charger according to the second exemplary embodiment of the present disclosure.

FIG. 9 is a graph showing noise measured before employing the shield of the quick charger according to the second exemplary embodiment of the present disclosure. FIG. 10 is a graph showing noise measured after employing the shield of the quick charger according to the second exemplary embodiment of the present disclosure.

It can be seen from FIGS. 9 and 10 that the noise is greatly reduced by employing the shield according to the exemplary embodiment of the present disclosure.

As described above, according to an exemplary embodiment of the present disclosure, the shield can prevent malfunction caused by electromagnetic waves. In addition, according to an exemplary embodiment of the present disclosure, the shield includes a shield frame and a shield cover.

Figure 11:
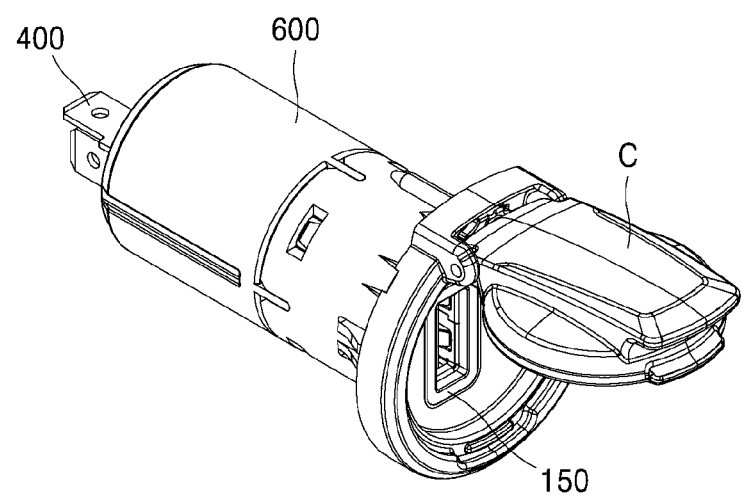
FIGS. 11 to 13 are perspective views of quick chargers for a vehicle according to modifications of the present disclosure.
Figure 12:
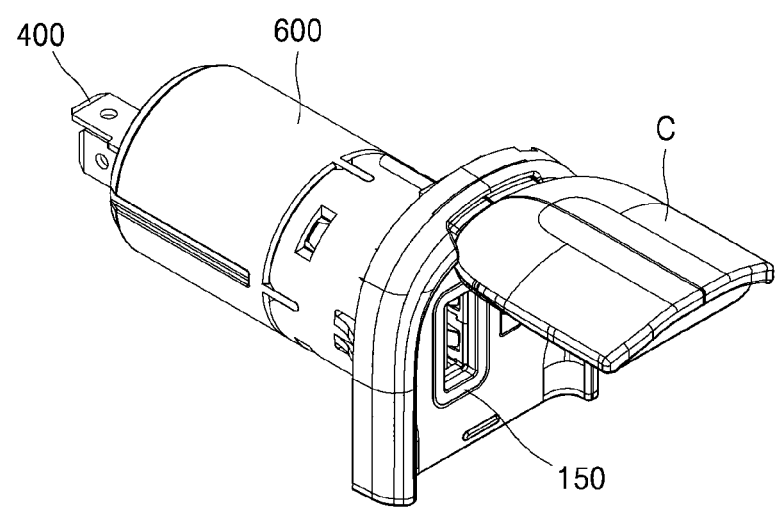
Figure 13:
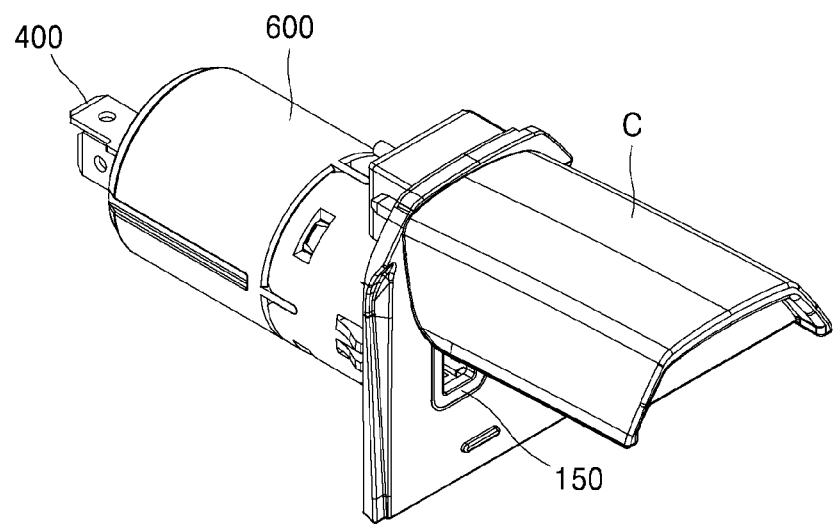

Although the present disclosure has been described with reference to the exemplary embodiments, those skilled in the art will appreciate that various modifications, additions and substitutions are possible without departing from the scope and spirit of the disclosure defined by the claims. For example, as shown in FIGS. 11 to 13, the quick charger for a vehicle according to an exemplary embodiment of the present disclosure may be implemented as a built-in device that is embedded in a vehicle, instead of a cigar jack. The quick charger shown in FIGS. 11 to 13 may be modified such that the input terminal can be connected to a power input connector or the like embedded in a vehicle, and the output port 150 and the cover C is exposed to the outside. The cover C may be opened and closed by a hinge. A variety of types of covers C may be provided as shown in FIGS. 11 to 13. The cover C shown in FIGS. 11 to 13 may also be employed by the quick charger for a vehicle according to the first and second exemplary embodiments of the present disclosure.

The invention claimed is:

1. A quick charger for a vehicle, comprising:
an input terminal receiving power from the vehicle;
an output port configured to be connected to an electronic device and comprising a power port and a communication port;
a charging voltage changing circuit configured to convert a voltage of the power applied to the input terminal into a normal charging voltage or a quick charging voltage larger than the normal charging voltage, depending on a level of a voltage sensed at the communication port connected to the electronic device;
a shield of a metal material covering at least one of the input terminal, the output port or the charging voltage changing circuit; and
a case in which the charging voltage changing circuit including the shield is accommodated for protection, wherein:
the shield comprises a shield frame disposed on a substrate having the input terminal, the output port and the charging voltage changing circuit thereon, and a shield cover fastened to the shield frame to cover an open top of the shield frame, the shield cover including cover side walls, the shield frame including frame side walls;
the shield cover includes the cover side walls in contact with outer faces of the frame side walls, and a cover top plate that is in contact with the cover side walls, covers a top of the shield frame, and is concavely curved toward the shield frame;
at least one cover hole is formed in the shield cover;
the shield frame includes the side walls, frame fastening holes formed in the frame side walls, one frame connector connecting between one side of the frame side walls and the other side thereof, and a cover fastening protrusion that is formed on the cover side walls in an embossed shape and is engaged into a respective frame fastening hole;
the cover top plate includes a pair of first cover top plates that are curved and a second cover top plate that is flat and connects between the pair of first cover top plates;
the communication port has a D+ pin and a D− pin, wherein the normal charging voltage is 5 V, and wherein the charging voltage changing circuit converts the voltage of the power applied to the input terminal into 5 V if a voltage at the D+ pin is 0.6 V and a voltage at the D− pin is 0 V;

the communication port has the D+ pin and the D− pin, wherein the quick charging voltage is 9 V or 12 V, wherein the charging voltage changing circuit converts the voltage of the power applied to the input terminal into 9 V if the voltage at the D+ pin is 3.3 V and the voltage at the D− pin is 0.6 V, and converts the voltage of the power applied to the input terminal into 12 V if the voltage at the D+ pin is 0.6 V and the voltage at the D− pin is 0.6 V; and the electronic device is charged with the normal charging voltage at a normal speed and is charged with the quick charging voltage at a faster speed than the normal speed.

\* \* \* \* \*